United States Patent
Chapman et al.

(10) Patent No.: US 7,472,818 B2
(45) Date of Patent: Jan. 6, 2009

(54) SELECTIVE REWORK PROCESS AND APPARATUS FOR SURFACE MOUNT COMPONENTS

(75) Inventors: Brian D. Chapman, Poughkeepsie, NY (US); Mary A. Emmett, Poughkeepsie, NY (US); Arden S. Lake, Poughkeepsie, NY (US); Wai Mon Wa, Poughkeepsie, NY (US); Nandu N. Ranadive, Wappingers Falls, NY (US); Michael Variano, Huntersville, NC (US); John P. Weir, Lagrangeville, NY (US)

(73) Assignee: International Business Machines Corporation, Armonk, NY (US)

(*) Notice: Subject to any disclaimer, the term of this patent is extended or adjusted under 35 U.S.C. 154(b) by 321 days.

(21) Appl. No.: 11/414,030

(22) Filed: Apr. 28, 2006

(65) Prior Publication Data

US 2007/0251981 A1 Nov. 1, 2007

(51) Int. Cl.
*B23K 1/018* (2006.01)
*B23K 28/00* (2006.01)
*B23K 1/20* (2006.01)
*B23K 1/00* (2006.01)
*B23K 5/22* (2006.01)

(52) U.S. Cl. .................. 228/191; 228/264; 228/13; 228/19

(58) Field of Classification Search ............ 228/13, 228/19, 119, 191, 264; 432/1–31
See application file for complete search history.

(56) References Cited

U.S. PATENT DOCUMENTS

| 5,003,160 | A | | 3/1991 | Matsuo et al. ............ 219/494 |
| 5,128,506 | A | | 7/1992 | Dahne et al. ............ 219/85.13 |
| 5,560,531 | A | * | 10/1996 | Ruszowski ................ 228/19 |
| 2002/0000329 | A1 | | 1/2002 | Hoffmeyer et al. ......... 174/256 |
| 2005/0071993 | A1 | | 4/2005 | Farooq et al. ................ 29/762 |

FOREIGN PATENT DOCUMENTS

| JP | 2004253406 A | 9/2004 |
| WO | WO9623616 A1 | 8/1996 |

* cited by examiner

*Primary Examiner*—Jessica L Ward
*Assistant Examiner*—Megha Mehta
(74) *Attorney, Agent, or Firm*—John A. Campbell; Floyd A. Gonzalez; Joseph A. Biela

(57) ABSTRACT

An apparatus and method for selective rework for surface mount components. A shield assembly encloses a circuit board on which Surface Mount Technology (SMT) modules are soldered. The shield assembly includes a top shield member having an opening over an SMT module to be removed from the circuit board, and a bottom shield member having an opening exposing the solder mount of the SMT module to be removed. An intermediate shield member is located in the opening in the top shield member and extends through the opening to the circuit board and surrounds the SMT module to be removed. A spring loaded mechanism is positioned over the intermediate shield member and grips the SMT module to be removed. The spring loaded mechanism applies removal force for removing the SMT module from the circuit board when heat is applied causing the solder holding the SMT module to the circuit board to reflow.

9 Claims, 3 Drawing Sheets

SELECTIVE REWORK PROCESS AND APPARATUS FOR SURFACE MOUNT COMPONENTS

FIELD OF THE INVENTION

This invention relates rework of components of an electrical circuit board, and more particularly relates to the selective for surface mount components mounted on a printed circuit board.

BACKGROUND OF THE INVENTION

This invention solved the distortion problem of a circuit board during the rework of a Surface Mounted Technology (SMT) device such as a Ceramic Column Grid Array (CCGA) integrated circuit package, or a Ceramic Ball Grid Array (CBGA) integrated circuit package. The distortion of the circuit board is due high temperature differences during the CCGA rework process. The high temperature differences cause non-uniform expansion of the circuit board. The surface mount attachment specification for CCGA and CBGA states that the reworked area of the circuit board must be flat to 2 mils per inch. Circuit boards with more than 2 mils/inch bow in the reworked site will typically have time zero electrical opens or early reliability fails. The known solution to this problem is to apply a global preheat to the bottom of the circuit board and then use a localized top side heat source to reflow the solder joints of the surface mounted device. The drawback of such known solutions is trying to minimize high temperature differences across the circuit board. An additional solution is required such as this invention because of the large size of the surface mounted device (52 .mm CCGA), the long manufacturing cycle time required to heat the circuit board and device, and the temperature differences in the rework site are must be reduced. This invention is also valuable for lead (Pb)-free rework since the Tin/Silver/Copper (SAC) alloy requires a higher temperature for reflow.

SUMMARY OF THE INVENTION

The core idea of the invention is to shield the entire circuit board assembly and expose only the surface mount device that requires rework. A spring loaded mechanism will be attached to the device. The entire assembly is then loading into a continuous belt reflow oven. Once the exposed device reaches the reflow temperature the spring loaded mechanism will vertically pull the device off the circuit board. Other components that are shielded will not reflow.

It is a principal object of the present invention to provide minimal temperature differences and distortion across the rework site and the entire circuit board assembly.

It is another object of the present invention to provide shielded portion of the circuit board having minimal temperature differences.

It is another object of the present invention to provide a manufacturing cycle time for removing a device which is five times faster than the prior art solution.

It is an additional object of the present invention to provide multiple devices on the circuit board which may be reworked simultaneously in the reflow oven.

It is a further object of the present invention to enable a mass production rework or component upgrade with a process that is cost effective.

System and computer program products corresponding to the above-summarized methods are also described and claimed herein.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION OF THE INVENTION

Figure 1:
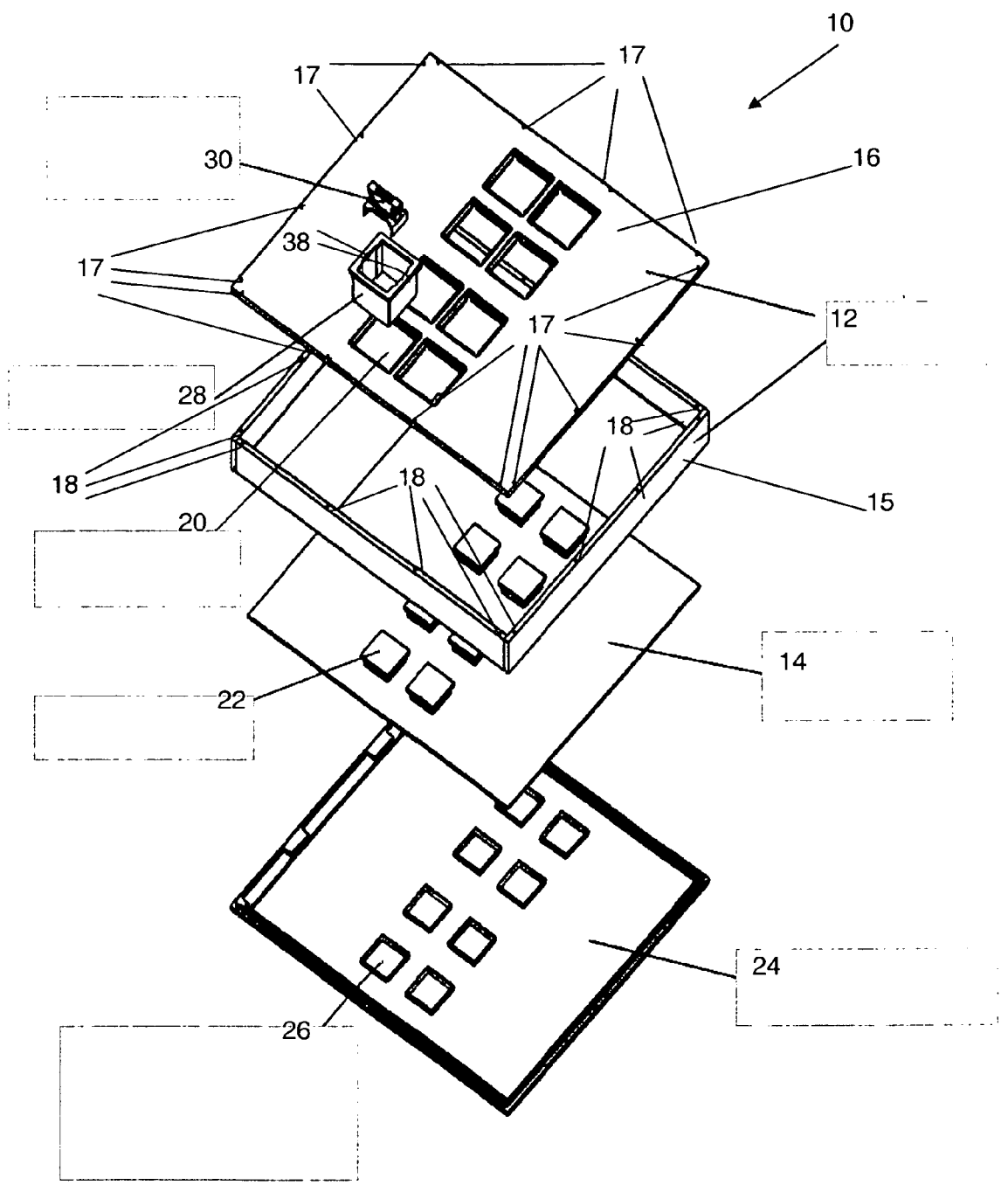
FIG. 1 is an exploded view of one embodiment of an shielded assembly of the present invention.

FIG. 1 is an exploded view of the present invention 10 as it is used with a circuit board during the rework of a surface mounted device. The invention 10 includes a top shield assembly 12 which is positioned over a circuit board assembly 14. The shield assembly 12 includes a four sided shield piece 15 which is topped by a top piece 16. The top piece 16 is attached to the shield piece 15 by appropriate fasteners through opens 17 and 18. The top piece 16 has top shield opening 20 which provide access to SMT devices 22 mounted on the circuit board. The circuit board 14 is positioned over a bottom shield 24 having bottom shield opening 26 which allows access to the bottom of the circuit board 14 under the SMT device 22. A four sided shield 28 is sized to fit into the top shield opening 20 to provide shielding through the fop shield assembly 12 over the SMT device 22. A spring loaded mechanism 30 fits over the four sided shield 28 to be explained. The top openings 20 and bottom openings 26 have removable covers of FIG. 4, as will be explained.

Figure 2:
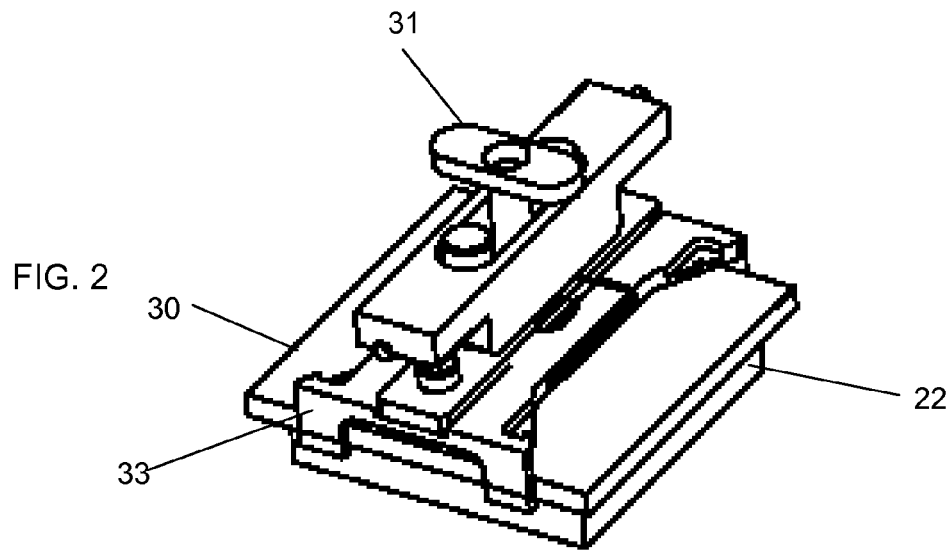
FIG. 2 is a perspective view and FIG. 3 is an end view of a spring loaded removal mechanism of the shielded assembly of FIG. 1.
Figure 3:
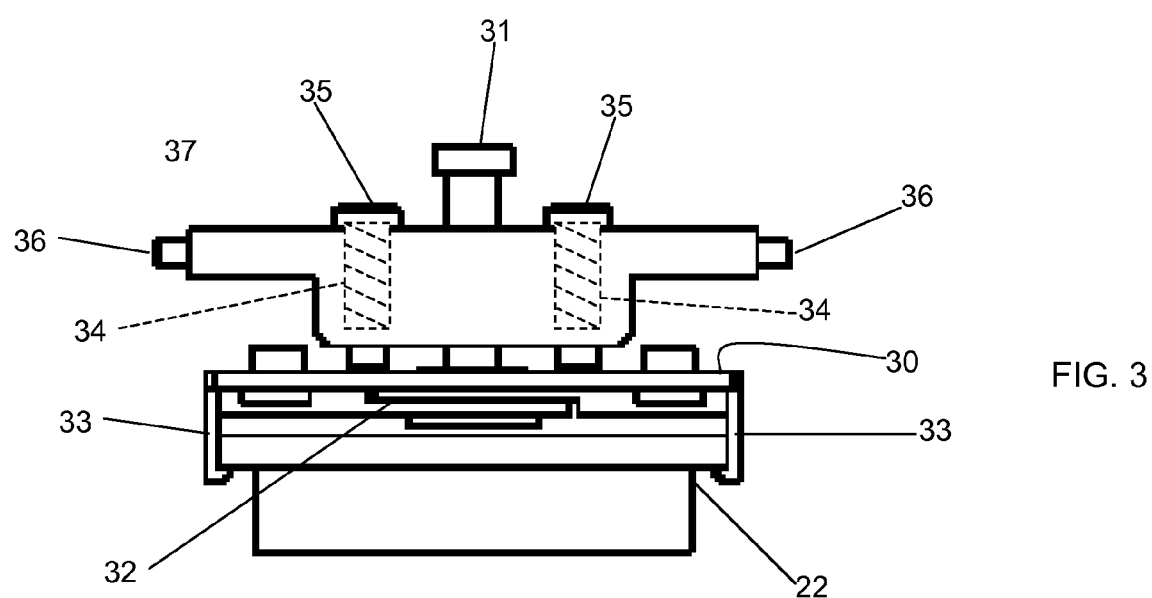

FIG. 2 is a perspective view and FIG. 3 is an end view of the spring loaded mechanism 30. The spring loaded removal mechanism 30 is used to separate the SMT device or chip 22 from the circuit board 14 by use of spring force when reflow is reached. The mechanism 30 is applied to the chip 22 by rotating handle 31 for 90 degrees and pushing handle 31 downward to the top of the chip 22. Then rotating handle 31 for 90 degrees again to grip and lock onto chip 22. The rotation of the handle 31 operates cam 32 which spreads jaws 33 and spring returns them, locking onto the chip 22. It will be understood that the chip 22 includes an upper cooling plate and a lower ceramic portion. The jaws 33 grip the upper cooling plate of the chip 22, as shown in FIGS. 2 and 3. In this position, the springs 34 under the shoulder screws 35 apply the removal force to the mechanism 30. The pins 36 which are pressed into the housing 37 are located into notches in the four sided shield 28 (see FIG. 1) which is referenced to the board surface. The springs 34 are selected/sized to apply the optimum force to lift the weight of the chip 22 at the proper time interval during reflow.

Figure 4:
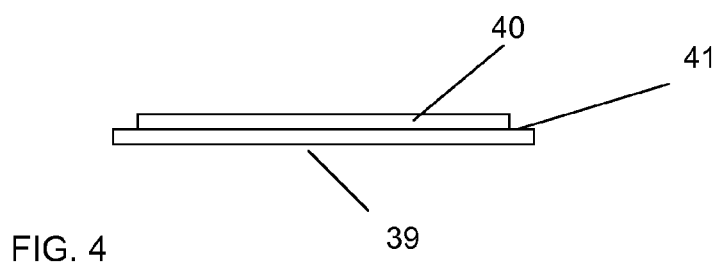
FIG. 4 is an illustration of a cover for the shielded assembly of FIG. 1.

FIG. 4 is a side or end view to one of the covers 39 which fit over the top and bottom openings 20 and 26. The cover 39 includes an inner portion 40 which fits into the openings 20 and 26, and includes a lip portion 41 which provides for the removal of the cover 39 from the openings 20 and 26.

The outer shield 12 and 24 for the circuit board assembly 14 is made of a high temperature electrical insulating materials such as material sold under the trademark of Delmat owned by ISOLA Composites of Delle, France and available from Polymer Plastics Corporation of Reno, Nev. and the inside of 12 and 28 is insulated with a layer of protective fibers such as fibers sold under the trademark Nomex owned by E.I. du Pont De Nemours and Company of Wilmington, Del., and available from DuPont Advanced Fibers Systems, Richmond, Va.

The shield is a top piece 16 and bottom piece 24 that encases the entire circuit board assembly 14. There are top and bottom openings 20 and 26 on the shield 12 and 24 that correspond to the surface mounted devices. In this case, the openings are sized for the 52 mm CCGA integrated circuit packages. Covers 35, which may be made of Delmat material, are made for the each of the top and bottom openings 20 and 26. The top and bottom covers 35 are removed for the CCGA module or device that requires rework. The other covers 35 remain on openings 20 and 26. A four sided Delmat shield 28 is made to insert into the opening of the top side shield 16. This four sided shield 28 will shield the sides surrounding the CCGA device or module 22 that requires rework. The spring loaded mechanism 30 provides an upward spring force that overcomes the surface tension of the solder and weight of the CCGA module 22. The spring loaded mechanism 30 attaches to the four-sided shield 28 and uses the attachment points as fixed references.

Figure 5:
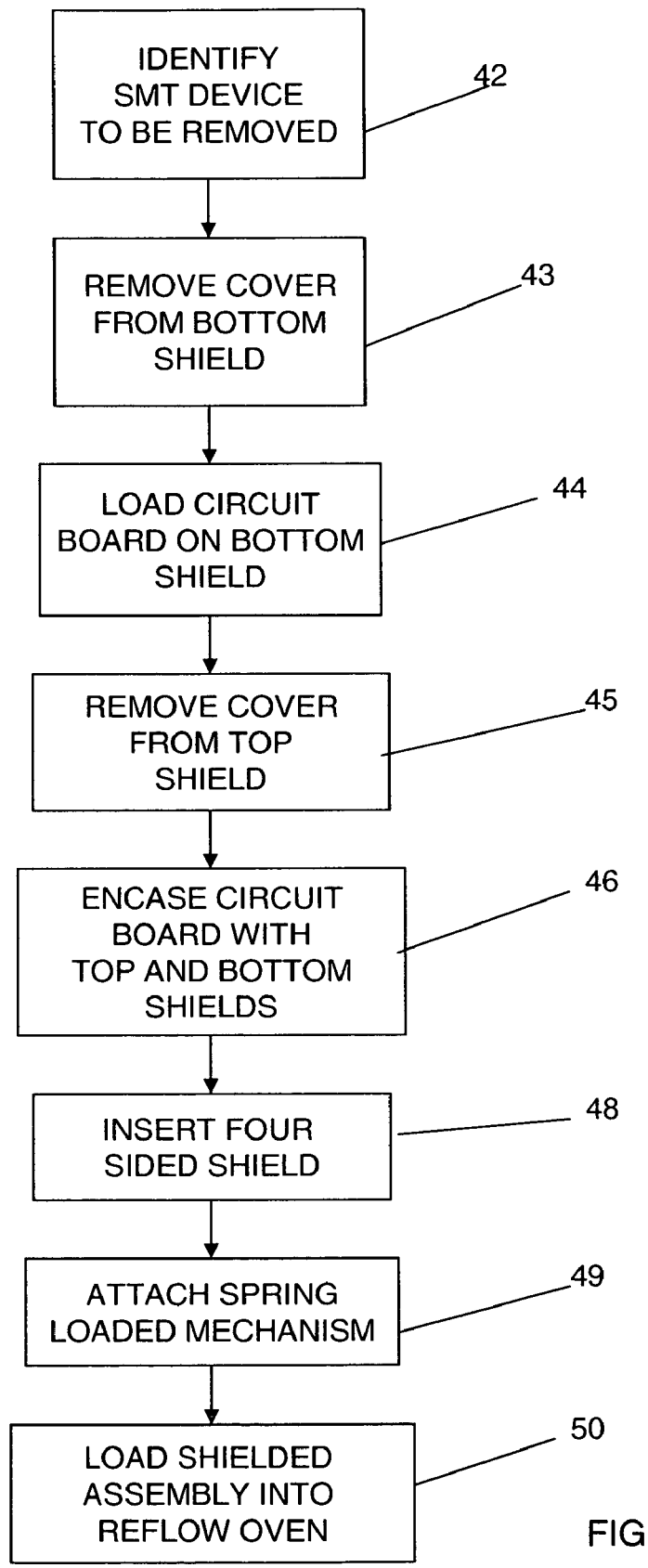
FIG. 5 is a process flow diagram for the use of the shielded assembly of FIG. 1

FIG. 5 is a diagram showing the steps of the CCGA module removal process. At 42, the 52 mm CCGA to be removed is identified. At 43, the cover 39 on the bottom shield that corresponds to the identified CCGA module is removed. At 44, the circuit board 14 is loaded on to the bottom shield 24. At 45, the cover 39 on the top shield that corresponds to the identified CCGA module is removed. At 46, the top shield assembly 12 and the bottom shield 24 are aligned to encase the circuit board assembly 14. At 48, the four sided shield 28 is inserted into the opening 20 of the top side shield 16. At 49, the spring loaded mechanism 30 is attached to the identified CCGA module 22 and the four-sided shield 28. At 50, the entire shielded assembly 10 is loaded into a continuous belt reflow oven, and the assembly 10 is heated for reflow until the identified module 22 is removed from the circuit board 14 by the spring loaded mechanism 30.

The flow diagrams depicted herein are just examples. There may be many variations to the diagram or the steps (or operations) described therein without departing from the spirit of the invention. For instance, the steps may be performed in a differing order, or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method for removing a Surface Mount Technology (SMT) module soldered to a circuit board, the method comprising:
   centering an opening through a top shield member over an SMT module to be removed from the circuit board;
   aligning an opening through a bottom shield member exposing the solder mount of the SMT module to be removed;
   locating an intermediate shield member in the opening in said top shield member, said intermediate shield member extending to the circuit board and surrounding the SMT module to be removed; and
   engaging a spring loaded mechanism positioned over said intermediate shield member for gripping the SMT module to be removed, said spring loaded mechanism applying removal force for removing the SMT module from the circuit board when heat is applied causing the solder holding the SMT module to the circuit board to reflow.

2. The method according to claim 1 further comprising making said top and bottom shield members and said intermediate shield member of electrical insulating material.

3. The method according to claim 2 wherein the electrical insulating material is a high temperature electrical insulating material.

4. The method according to claim 2 further comprising lining the top and bottom shield members with heat protective material.

5. The method according to claim 4 wherein the heat protective material is a protective synthetic fiber material.

6. The method according to claim 2 further comprising:
   providing said top shield member with multiple openings, each opening over an SMT module position; and
   providing said bottom shield member with multiple openings, each opening corresponding to an opening in said top member and under an SMT module position.

7. The method according to claim 6 further comprising covering with covers, the openings in said top and bottom members except for the openings exposing an SMT module to be removed.

8. The method according to claim 7 further comprising making said covers of electrical insulating material.

9. The method according to claim 8 wherein said electrical insulating material is a high temperature electrical insulating material.

\* \* \* \* \*